FREQUENCY DIVIDER CIRCUIT

Filed July 6, 1954

INVENTOR.
EMIL E. SANFORD
BY Darby & Darby
ATTORNEYS 2,820,899
Patented Jan. 21, 1958

2,820,899

FREQUENCY DIVIDER CIRCUIT

Emil E. Sanford, Clifton, N. J., assignor to Allen B. Du Mont Laboratories, Inc., Clifton, N. J., a corporation of Delaware Application July 6, 1954, Serial No. 441,391

6 Claims. (Cl. 250—36)

Figures 1, 2:
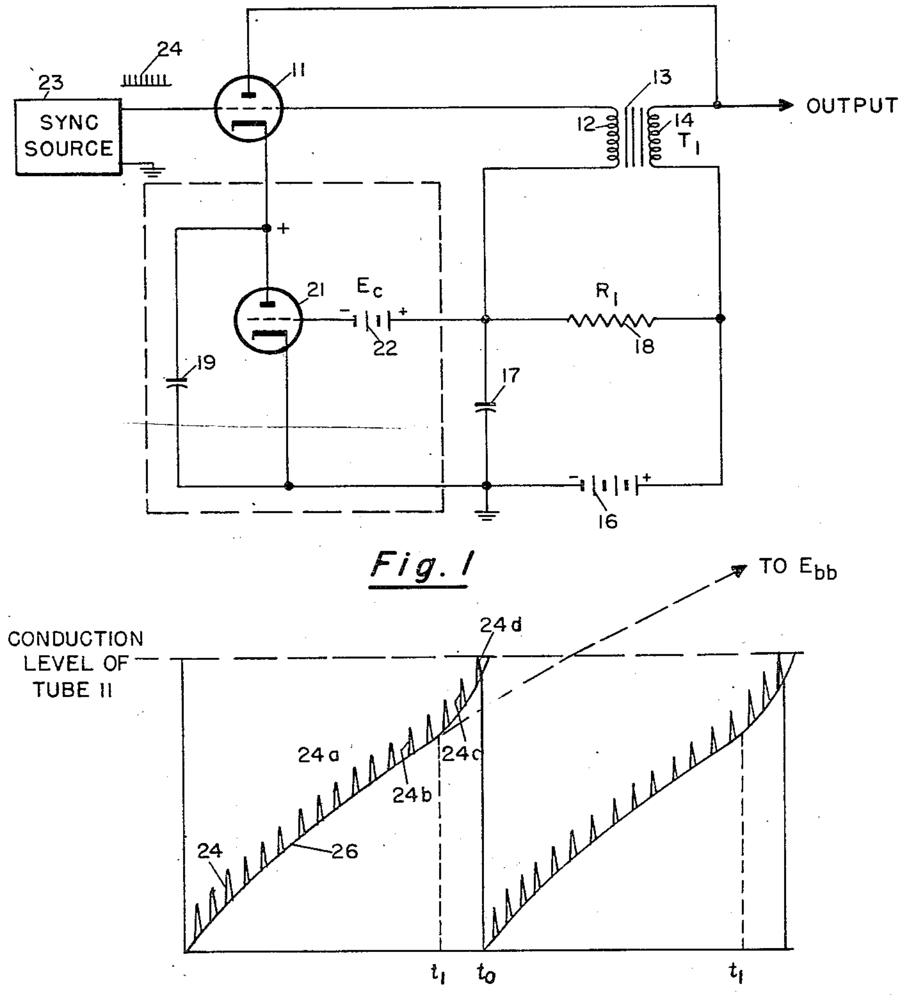

This invention relates to electrical frequency-divider circuits synchronized by input signals of a predetermined repetition rate and generating output signals with lower repetition rates. The invention relates in particular to blocking oscillator frequency-divider circuits for high ratio dividing, i. e. for producing output pulse waves having very much lower repetition rates than the input synchronizing rates.

In frequency divider circuits it is well known to apply a pulse sychronizing wave to a blocking oscillator circuit in such a way that the voltage pulses of the synchronizing wave are added to the grid-cathode voltage of the oscillator tube. Normally, this grid-cathode voltage is an exponentially increasing voltage, the rate of change of which decreases with time so that the voltage difference between the peaks of successive synchronizing pulses added to the exponential voltage becomes successively lower, pulse by pulse. For a division ratio greater than about 10:1 the amplitude difference between the pulse which is to trigger the oscillator and the immediately preceding pulse is so small that it is difficult to prevent erratic operation of the circuit due to random changes in the characteristic of the circuit components or due to noise pulses.

It is one object of this invention to provide an improved frequency-divider circuit.

Other objects are to provide a frequency-divider circuit having excellent stability for relatively small frequency-division ratios in the range of 10:1 or less, or good stability for ratios in the range of 25:1.

Other objects will be apparent from the following specification, together with the drawings, in which, Fig. 1 is a schematic circuit diagram of a frequency divider circuit incorporating the invention; and Fig. 2 is a graphical showing of a voltage wave form obtained in the operation of the circuit of Fig. 1.

The invention comprises a parallel circuit connected in series with the grid-cathode circuit of a frequency-dividing oscillator tube. The parallel circuit consists of a condenser connected in parallel with the plate-cathode circuit of an amplifier tube. The parallel circuit is so connected that a charge accumulates on the condenser during active part of the oscillator cycle and is maintained during most of the inactive, or relaxation, part of the oscillator cycle, during which time the parallel amplifier tube is non-conductive. Just before the end of the relaxation part of the cycle, the amplifier tube is made conductive by voltage derived from the relaxation oscillator so that the amplifier tube is transformed from a substantially infinite impedance to a finite impedance which, being in parallel with the condenser, operates to discharge the condenser. The discharging voltage of the condenser increases the overall rate of change of voltage between the grid and cathode of the oscillator tube and provides increased amplitude separation between the triggering synchronizing pulse and those pulses immediately preceding it.

The circuit of Fig. 1 comprises an oscillator tube 11 having a grid connected to the primary 12 of a blocking oscillator transformer 13. The plate of tube 11 is connected to a secondary 14 of transformer 13 and a D. C. voltage source 16 is connected from the secondary 14 to a common ground. A relaxation condenser 17 is connected between the primary winding 12 and ground and a charging resistor 18 is connected between the positive terminal of source 16 and the junction of primary 12 and condenser 17. The cathode of tube 11 is connected to ground by a parallel circuit consisting of a condenser 19 and the plate-cathode circuit of an amplifier tube 21. The grid of tube 21 may be connected to the junction of the resistor 18 and condenser 17 by any convenient biasing means, such as battery 22 or an equivalent long time constant resistance-capacitance network of any well known type.

A synchronizing source 23 supplies a relatively high repetition rate pulse wave 24 to the grid of tube 11. Alternatively, the synchronizing source 23 might supply pulses of the opposite polarity to the cathode of tube 11 or it might supply the pulses at any point so that the pulses would be added in series between the grid and cathode and polarized to tend to make the grid positive with respect to the cathode at the occurrence of each of the pulses.

Referring to Fig. 2, which shows the voltage between the grid and cathode of tube 11, the operation of the circuit will now be described beginning at the time $t_0$ just after the active portion of the cycle of the oscillator. At that time, the condenser 17 has a charge of such polarity as to make the terminal connected to resistor 18 negative with respect to the other terminal, and the condenser 19 has impressed thereon a voltage polarized to make the plate of tube 21 positive with respect to the cathode of that tube. In the well known way, the condenser 17 immediately starts to charge through resistor 18 exponentially along the path 26 of Fig. 2. Since the resistor 18 is connected to the positive terminal of source 16, the exponential charge of condenser 17 is asymptotic to the voltage at the positive terminal of source 16, which is usually designated $E_{bb}$.

Since, during this relaxation period of the cycle, both tubes 11 and 21 are non-conductive, there is no circuit to discharge condenser 19, and the voltage thereacross is maintained substantially at its original level. However, as the voltage across condenser 17 becomes more positive (or less negative), a point is reached at which tube 21 becomes conductive. This point is determined by the characteristics of the tube and by the voltage bias of source 22. It will be assumed to occur at time $f_1$. As tube 21 becomes conductive, it changes from a substantially infinite impedance to a finite impedance which, being in parallel with condenser 19, discharges the voltage thereacross and reduces the positive voltage at the cathode of tube 11. This change in the voltage across condenser 19 is added to the change across condenser 17, but the voltage of the grid of tube 11 is still too greatly negative, with respect to the cathode thereof, to allow tube 11 to conduct. However, as shown in Fig. 2, the rate of change of voltage between the grid and cathode of tube 11 increases in the direction of the conduction level after the time $t_1$ when tube 21 starts to conduct.

Meanwhile, each of the pulses 24 is added to the grid cathode voltage of tube 11, as shown in Fig. 2. Prior to time $t_1$, the difference in the peak level of any two successive pulses, say pulses 24*a* and 24*b*, is relatively small but, after tube 21 starts to conduct, the difference in the voltage level between pulse 24*c* and 24*d* is considerably larger. This means that the values of the circuit components could change by a relatively large amount, as may actually occur through aging of the components, and the tube 11 would still be made conductive by pulse 24*d*. On the other hand, if the original rate of change of voltage between cathode and grid of tube 11 were maintained as shown between the times $t_0$ and $t_1$, it would be necessary to synchronize the operation of tube 11 by pulses having only a small difference in voltage level as exemplified by pulses 24*a* and 24*b*. In that event, only a small change due to aging, etc. could be tolerated in the various components of the circuit. Since it is well known that tubes age and that the voltage supplied by plate voltage sources such as source 16 varies, it is obvious that a circuit which provides the maximum tolerance is desirable.

It should be noted that the discharge rate of condenser 19 is not necessarily linear but increases with time as the impedance of the plate-cathode circuit of tube 21 decreases more and more from its initial, substantially infinite impedance prior to time $t_1$. This increasingly fast discharge of condenser 19 gives to the voltage curve 26 a bend which is upwardly over the range shown immediately following the time $t_1$. As a result, the separation in amplitude between each of the succeeding pulses 24 increases after time $t_1$ and even for very large frequency-division, or count down, ratios there will be ample separation between the triggering pulse 24*d* and the immediately preceding pulse 24*c*.

At the occurrence of the pulse 24*d*, the tube 11 suddenly reaches its conductive level and, in the well-known manner of blocking oscillators, discharges condenser 17 which returns to its original very negative level and places a renewed charge on condenser 19 so that the second relaxation period of the oscillator may begin.

Although this invention has been described in terms of a single embodiment, it will be understood by those skilled in the art that modifications may be made therein within the scope of the following claims.

What is claimed is:

1. A frequency divider circuit comprising a blocking oscillator including a blocking oscillator tube having a grid-cathode circuit, a voltage changing circuit connected in series with said grid-cathode circuit, said voltage changing circuit comprising a first and a second condenser connected in series and an amplifier tube having a plate-cathode circuit connected in parallel with said first condenser with the cathode of said amplifier tube connected to the junction of said first and second condensers, said amplifier tube also having a grid; a charging circuit connected to said second condenser; and a connection from said second condenser to said grid whereby the voltage across said second condenser is connected between the grid and cathode of said amplifier tube to render said amplifier tube conductive at a predetermined time in the operating cycle of said oscillator.

2. A frequency divider circuit comprising a blocking oscillator having a first series circuit including, in order, a positive terminal of a source of D. C. voltage, a first winding on a transformer, the plate of an oscillator tube, the cathode of said tube, a first condenser, and a negative terminal of said source; an amplifier tube having a plate connected to said cathode, and a cathode connected to said negative terminal; a second series circuit comprising, in order, the grid of said oscillator tube, a second winding of said transformers, a second condenser, and said negative terminal; a charging resistor connected in series between said positive terminal and the junction of said second winding with said second condenser; a synchronizing voltage source connected effectively in series between said grid and said cathode of said oscillator tube; and a connection between said junction of said second winding with said second condenser and a control grid of said amplifier tube.

3. An electronic frequency divider circuit comprising: a relaxation oscillator tube having a grid, a cathode, and an input circuit; an amplifier tube having a plate, a grid, and a cathode; a connection between said amplifier plate and said oscillator cathode; a condenser connected in parallel with said amplifier tube between said plate and said cathode; a source of exponential voltage connected to said grid of said relaxation tube; said relaxation tube being normally biased to cutoff by the sum of voltages across said condenser and said source of exponential voltage; a source of biasing voltage connected between the grid and cathode of said amplifier tube to bias said amplifier tube to cutoff; a connection between said grid of said amplifier tube and said source, said exponential voltage being polarized to cause said relaxation tube and said amplifier tube to approach conductivity as said exponential voltage is applied.

4. The circuit of claim 3 including a source of synchronizing impulses connected to said input circuit of said relaxation tube, the pulses of said synchronizing source being polarized to drive said relaxation tube toward conductivity.

5. A frequency divider comprising: an oscillator tube having a grid and a cathode; grid bias means, including a capacitance, to apply a negative bias to said grid; cathode-bias means to apply a positive bias to said cathode, said cathode bias means including a second capacitance connected in the cathode circuit of said tube; an electron discharge device having an anode, a grid, and a cathode, said device having its anode cathode circuit connected in parallel with said second capacitance; bias means connected to said grid of said device; means causing said first capacitance to produce a positive going exponential voltage, thereby reducing the negative bias on said grid of oscillator tube; means causing said exponential voltage to overcome said grid bias of said device, whereby said device becomes conductive to discharge said second capacitance and reduce said positive cathode bias on said oscillator tube.

6. The circuit of claim 5, including pulse means to drive said oscillator tube toward conductivity.

References Cited in the file of this patent

UNITED STATES PATENTS

| | | |
|---|---|---|
| 2,441,418 | Houghton | May 11, 1948 |
| 2,740,047 | Bayliss | Mar. 27, 1956 |

FOREIGN PATENTS

| | | |
|---|---|---|
| 487,982 | Great Britain | June 29, 1938 |
| 595,345 | Great Britain | Dec. 2, 1947 |